(12) United States Patent
Tomono (10) Patent No.: US 9,490,170 B2
(45) Date of Patent: Nov. 8, 2016

(54) MANUFACTURING METHOD OF SEMICONDUCTOR DEVICE

(71) Applicant: KABUSHIKI KAISHA TOSHIBA, Tokyo (JP)

(72) Inventor: Akira Tomono, Yokkaichi Mie (JP)

(73) Assignee: Kabushiki Kaisha Toshiba, Tokyo (JP)

(*) Notice: Subject to any disclaimer, the term of this patent is extended or adjusted under 35 U.S.C. 154(b) by 77 days.

(21) Appl. No.: 14/634,705

(22) Filed: Feb. 27, 2015

(65) Prior Publication Data

US 2016/0079119 A1  Mar. 17, 2016

(30) Foreign Application Priority Data

Sep. 17, 2014  (JP) ................. 2014-188526

(51) Int. Cl.
*H01L 21/00* (2006.01)
*H01L 21/78* (2006.01)
*H01L 21/683* (2006.01)

(52) U.S. Cl.
CPC ........... *H01L 21/78* (2013.01); *H01L 21/6835* (2013.01); *H01L 2221/6834* (2013.01); *H01L 2221/68318* (2013.01); *H01L 2221/68327* (2013.01); *H01L 2221/68386* (2013.01)

(58) Field of Classification Search
USPC ................................ 438/462, 464
See application file for complete search history.

(56) References Cited

U.S. PATENT DOCUMENTS

| | | | | |
|---|---|---|---|---|
| 6,075,280 A * | 6/2000 | Yung | ...................... | H01L 21/304 257/620 |
| 2001/0005043 A1 * | 6/2001 | Nakanishi | ........... | H01L 21/6835 257/678 |
| 2010/0227454 A1 * | 9/2010 | Dohmae | ................. | H01L 21/78 438/464 |
| 2011/0217826 A1 * | 9/2011 | Sakurada | .............. | H01L 21/304 438/462 |
| 2012/0329369 A1 * | 12/2012 | Shimizu | ................ | H01L 21/304 451/28 |
| 2013/0161795 A1 * | 6/2013 | Owada | ................ | H01L 21/6835 257/620 |
| 2013/0248099 A1 * | 9/2013 | Shimizu | .............. | H01L 21/6835 156/247 |

FOREIGN PATENT DOCUMENTS

JP  2013-201251 A  10/2013

* cited by examiner

*Primary Examiner* — Errol Fernandes
(74) *Attorney, Agent, or Firm* — Patterson & Sheridan, LLP (57) ABSTRACT

A method for manufacturing a semiconductor device includes preparing a structure including a semiconductor substrate having a plurality of semiconductor elements thereon, a cover layer covering the semiconductor elements, a supporting substrate, and an adhesive layer between the first adhesive layer and the supporting substrate, removing side edge portions of the semiconductor substrate and the adhesive layer, such that a side surface of the cover layer is exposed, forming, in the supporting substrate, fragile portions, the fragile portions extending in a first direction, attaching an adhesive sheet on a surface of the supporting substrate that is opposite to a surface that is in contact with the adhesive layer, and pulling on the adhesive sheet in a second direction different from the first direction, to peel off the supporting substrate and the adhesive layer from the semiconductor substrate having the semiconductor elements.

20 Claims, 8 Drawing Sheets

PEELING DIRECTION

FIG. 7

PEELING DIRECTION

MANUFACTURING METHOD OF SEMICONDUCTOR DEVICE

CROSS-REFERENCE TO RELATED APPLICATION

This application is based upon and claims the benefit of priority from Japanese Patent Application No. 2014-188526, filed Sep. 17, 2014, the entire contents of which are incorporated herein by reference.

FIELD

Embodiments described herein relate generally to a manufacturing method of a semiconductor device.

BACKGROUND

In processing a semiconductor substrate, such as thinning a semiconductor substrate, such as a silicon wafer, forming a circuit pattern at one part of a plane of the semiconductor substrate, and forming a through electrode, such as a through silicon via (TSV) on the semiconductor substrate, in order to maintain flatness of a processing surface of the semiconductor substrate, a supporting substrate is attached to the semiconductor substrate using an adhesive in a state where a warp of the semiconductor substrate is corrected before the processing.

After processing the semiconductor substrate, the supporting substrate should be removed from the semiconductor substrate. In order to remove the supporting substrate from the semiconductor substrate, for example, the semiconductor substrate or the supporting substrate may be pulled in a perpendicular direction of a substrate plane using a jig or the like. However, adhesion strength of the adhesive between the supporting substrate and the semiconductor substrate may be high. If so, it is not easy to remove the supporting substrate from the semiconductor substrate by pulling one of them with respect to the other.

In addition, in order to remove the supporting substrate from the semiconductor substrate, the semiconductor substrate or the supporting substrate may be peeled from the other by bending the semiconductor substrate or the supporting substrate. Since the semiconductor substrate after being processed is extremely thin, and is likely to be damaged when being bent, it is preferable that the supporting substrate, rather than the semiconductor substrate, be bent and peeled off. However, since a rigidity of the supporting substrate tends to be high, it is not easy to bend and peel off the supporting substrate.

DETAILED DESCRIPTION

In general, according to one embodiment, a method for manufacturing a semiconductor device includes preparing a structure including a semiconductor substrate having a plurality of semiconductor elements thereon, a cover layer covering the semiconductor elements, a supporting substrate, and an adhesive layer between the first adhesive layer and the supporting substrate, removing side edge portions of the semiconductor substrate and the adhesive layer, such that a side surface of the cover layer is exposed, forming, in the supporting substrate, fragile portions, the fragile portions extending in a first direction, attaching an adhesive sheet on a surface of the supporting substrate that is opposite to a surface that is in contact with the adhesive layer, and pulling on the adhesive sheet in a second direction different from the first direction, to peel off the supporting substrate and the adhesive layer from the semiconductor substrate having the semiconductor elements.

Hereinafter, embodiments will be described with reference to the drawings. In addition, the drawings are schematic, for example, there is a case where a relationship between a thickness and a plane dimension, a ratio of thickness of each layer, or the like, are different from reality. In addition, in each embodiment, the substantially same structural elements are referenced by the same reference numerals and the descriptions thereof will be omitted.

First Embodiment

Figure 1:
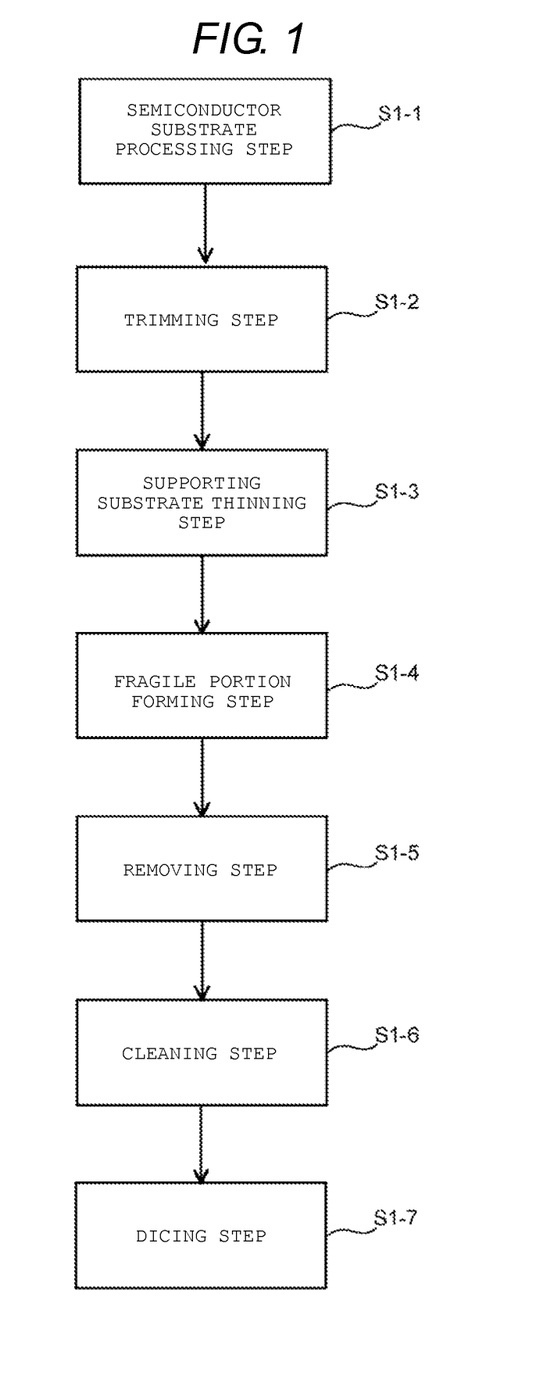
FIG. 1 is a flow chart illustrating a manufacturing method of a semiconductor device according to a first embodiment.

FIG. 1 is a flow chart illustrating an example of a manufacturing method of a semiconductor device. The example of the manufacturing method of the semiconductor device illustrated in FIG. 1 includes a semiconductor substrate processing step (S1-1), a trimming step (S1-2), a supporting substrate thinning step (S1-3), a fragile portion forming step (S1-4), a removing step (S1-5), a cleaning step (S1-6), and a dicing step (S1-7). In addition, an order of the steps is not limited to the order illustrated in FIG. 1. Furthermore, the above-described steps will be described with reference to FIGS. 2 to 10. FIGS. 2 to 10 are cross-sectional views of a semiconductor device during the manufacturing steps.

Figure 2:
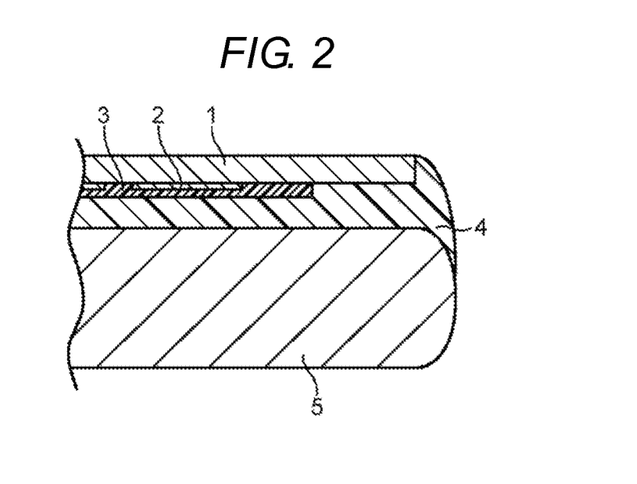
FIGS. 2-10 each illustrate a manufacturing step of the manufacturing method according to the first embodiment.

As illustrated in FIG. 2, in the semiconductor substrate processing step (S1-1), a workpiece (structure), which includes a semiconductor substrate 1, a semiconductor element 2, an adhesive layer 3, an adhesive layer 4, and a supporting substrate 5 is formed, and the semiconductor substrate 1 housed in the work piece is processed. The processing of the semiconductor substrate 1 is not particularly limited, but the processing include a thinning step of grinding one part of the semiconductor substrate 1 in a thickness direction, a circuit pattern forming step of forming a circuit pattern at one part of a plane of the semiconductor substrate 1, and a through electrode forming step of forming a through electrode, such as a TSV, which passes through the semiconductor substrate 1 or the like. In addition, in FIG. 2, the semiconductor substrate 1 is processed after the semiconductor element 2 is formed, but the process is not limited thereto, and the semiconductor substrate 1 may be processed before the semiconductor element 2 is formed.

The semiconductor substrate 1 is obtained after the semiconductor substrate processing step (S1-1). For example, a thickness of the semiconductor substrate 1 obtained after the thinning step is equal to or greater than 50 μm and equal to or smaller than 100 μm, for example. In addition, the semiconductor substrate 1 obtained after the circuit pattern forming step includes the circuit pattern provided at one part of the plane. In addition, in the circuit pattern forming step, the semiconductor element 2 may be formed. Furthermore, the semiconductor substrate 1 obtained after the through electrode forming step includes the through electrode which passes through the semiconductor substrate 1.

For example, the semiconductor substrate 1 is a silicon substrate, such as a monocrystal silicon substrate. The silicon substrate is preferable since it is easy to perform the through electrode forming or the thinning. In addition, a plane shape of the semiconductor substrate 1 is circular or rectangular, for example. Here, the semiconductor substrate 1 has a circular shape in a plane. In addition, for example, a sapphire substrate or a gallium arsenide substrate may be used as the semiconductor substrate 1.

The semiconductor element 2 is provided at one part of the plane of the semiconductor substrate 1. As the semiconductor element 2, it is possible to provide, for example, a transistor and a memory element of a NAND flash memory. In addition, it may not be necessary that the semiconductor element 2 be provided in the work piece.

The adhesive layer 3 is adhered to the semiconductor substrate 1 to cover the semiconductor element 2. In other words, the adhesive layer 3 is adhered to the semiconductor substrate 1 to cover one part of the plane of the semiconductor substrate 1. As the adhesive layer 3, for example, it is possible to use a liquid material which can be adhered to an object by a surface tension, such as a grease type oil fat, hydrocarbon resin, or the like.

The adhesive layer 4 is adhered to the semiconductor substrate 1 to cover the adhesive layer 3. At this time, for example, as the adhesive layer 4 is provided to cover the plane and the side surface of the semiconductor substrate 1, it is possible to suppress damage of the semiconductor substrate 1 during processing or conveying thereof. It is preferable that adhesion strength between the adhesive layer 4 and the semiconductor substrate 1 be higher than adhesion strength between the adhesive layer 3 and the semiconductor substrate 1. For example, the adhesion strength is a value which may be measured by a peeling test or the like based on JIS standard.

As the adhesive layer 4, for example, it is possible to use one of the adhesive materials which include an acrylic resin, the hydrocarbon resin (a polycycloolefin resin, a terpene resin, a petroleum resin, and the like), and a novolak type phenol resin, as a main component, or to use a mixture of a plurality of the adhesive materials. For example, the adhesive layer 4, which is formed as a front surface, is coated with a material while spinning the semiconductor substrate 1 or the supporting substrate 5 by using a coating device, such as a spin coater. According to the above-described method, it is possible to form the adhesive layer 4 having a uniform thickness, which is equal to or greater than 5 μm and equal to or less than 100 μm. In addition, the adhesive layer 3 may be formed using a method that may be employed in forming the adhesive layer 4.

The supporting substrate 5 is adhered to the adhesive layer 4 and the adhesive layer 3, and the adhesive layer 4 are provided between the supporting substrate 5 and the semiconductor substrate 1. A thickness of the supporting substrate 5 is appropriately set according to a material or an obtained intensity of the work piece. A side surface of the supporting substrate 5 is a warped surface due to chamfering or the like, but not limited thereto. A plane shape of the supporting substrate 5 is, for example, circular or rectangular. Here, the supporting substrate 5 which has a circular shape in a plane is used. As the supporting substrate 5, for example, it is possible to use a glass substrate, a silicon substrate, an alumina substrate, a silicon carbide (SiC) substrate, an aluminum substrate, a stainless steel substrate, and a resin substrate.

The work piece of the semiconductor substrate and the supporting substrate which is used in the semiconductor substrate processing step (S1-1) includes the semiconductor substrate, the supporting substrate, and the adhesive layers. Accordingly, for example, as the semiconductor substrate and the supporting substrate are attached to each other by the adhesive layers while a warp of the semiconductor substrate is corrected in advance, it is possible to improve flatness of the semiconductor substrate and to enhance processing accuracy with respect to the semiconductor substrate in the processing step.

Figure 3:
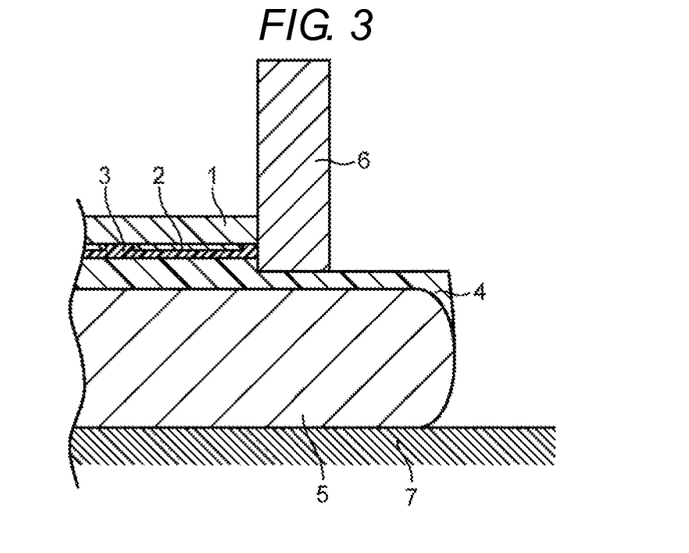

In the trimming step (S1-2), one part of the adhesive layer 4 is ground (called trimming) so that the circumferential edge of the adhesive layer 3 is exposed. For example, as illustrated in FIG. 3, the work piece is fixed to a spinning stage 7 and is spun. Furthermore, a blade 6, such as a diamond blade, is spun, and at least a side surface of the blade 6 comes into contact with the adhesive layer 4. Accordingly, it is possible to grind one part of the adhesive layer 4. At this time, one part of the supporting substrate 5 may be ground. In addition, one part of the semiconductor substrate 1 may also be ground, but the grinding is performed not to reach a part which is overlapped with the semiconductor element 2.

As the blade 6, for example, it is possible to use a dicing blade. At this time, the circumferential edge of the adhesive layer 3 may be exposed by grinding the adhesive layer 4 for several times step by step. In addition, the circumferential edge of the adhesive layer 3 may be exposed by one time of grinding by using a blade which has a thicker width than the dicing blade. The blade which is used in trimming is also called a trimming blade. In addition, a grinding method by the blade is not limited, but other methods may be used.

Figure 4:
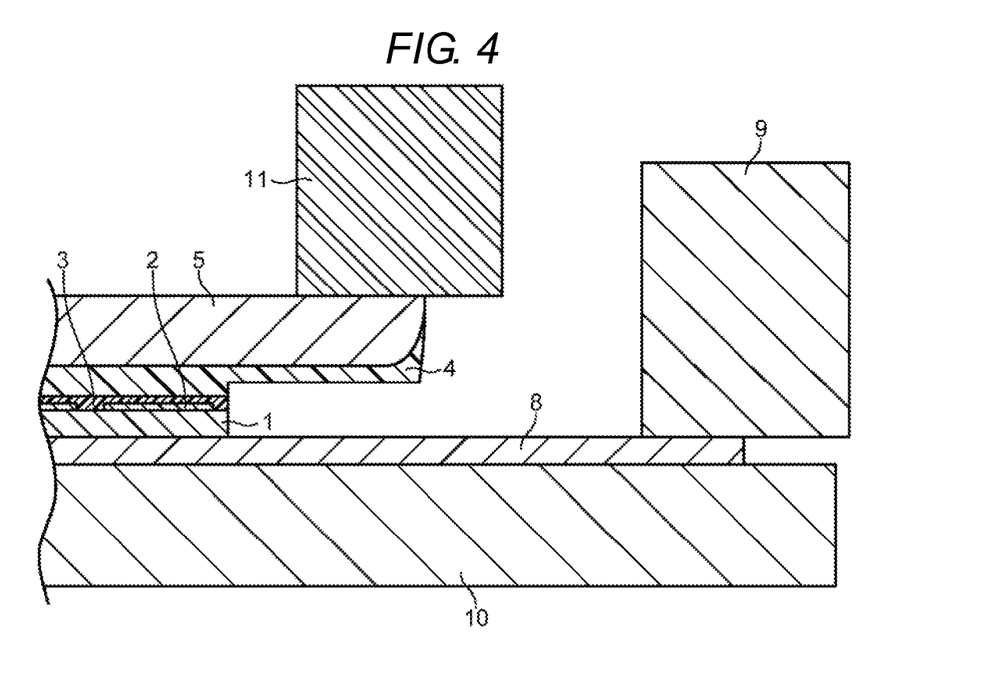

In the supporting substrate thinning step (S1-3), one part of the supporting substrate 5 is removed by grinding in a thickness direction from a surface (called an exposure surface of the supporting substrate 5) opposite to an adhesion surface between the supporting substrate 5 and the adhesive layer 4. For example, as illustrated in FIG. 4, a surface (called an exposure surface of the semiconductor substrate 1) opposite to an adhesion surface between the semiconductor substrate 1 and the adhesive layer 3 is attached to a holding tape 8, and a surface which is the same as an adhesion surface between the holding tape 8 and the work piece is attached to a holding ring 9. It is preferable that adhesion strength of the holding tape 8 with respect to the semiconductor substrate 1 be greater than the adhesion strength of the adhesive layer 3 with respect to the semiconductor substrate 1. After this, the work piece is reversed with the holding ring 9 upside down as shown in FIG. 4. Furthermore, in a state where the holding tape 8 is held in a table 10, it is possible to grind one part of the supporting substrate 5 using a whetstone 11 or the like. At this time, it is preferable to grind the supporting substrate 5 until a thickness of the supporting substrate 5 is equal to or less than 0.3 mm.

Figure 5:
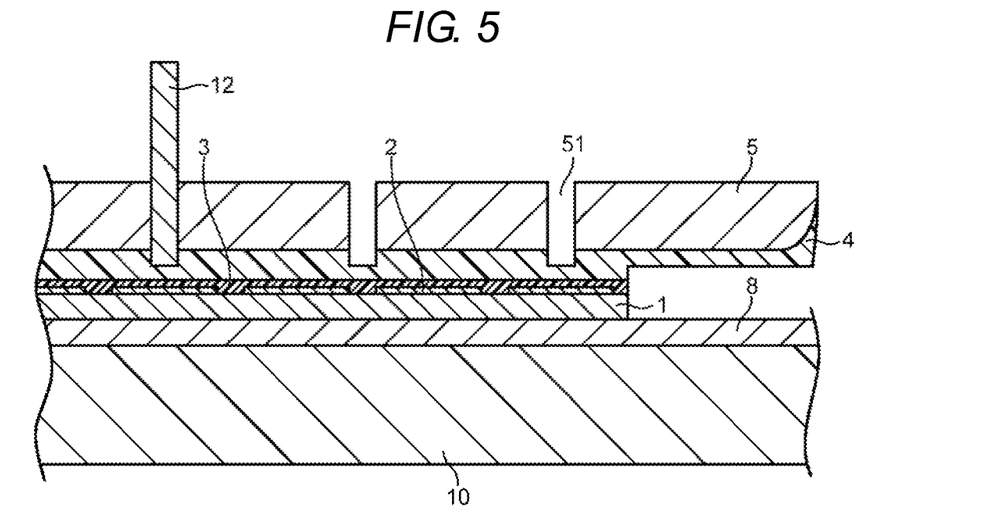

In fragile portion forming step (S1-4), a fragile portion 51 which extends along the plane of the supporting substrate 5 is formed. For example, as illustrated in FIG. 5, as a groove is formed at one part of the supporting substrate 5 from the exposed surface of the supporting substrate 5 using a blade 12, such as the diamond blade, it is possible to form the fragile portion 51. Accordingly, the supporting substrate 5 can be divided along the fragile portion 51. At this time, the groove does not reach the adhesive layer 4. By forming the groove up to the middle of the adhesive layer 4 so as not to reach the semiconductor element 2, it is possible to suppress damage of the semiconductor element 2 and the semiconductor substrate 1. As the blade 12, for example, it is possible to use the dicing blade or the like. In addition, instead of the blade 12, the blade 6 used during the trimming step (S1-2) may be used.

Figure 6:
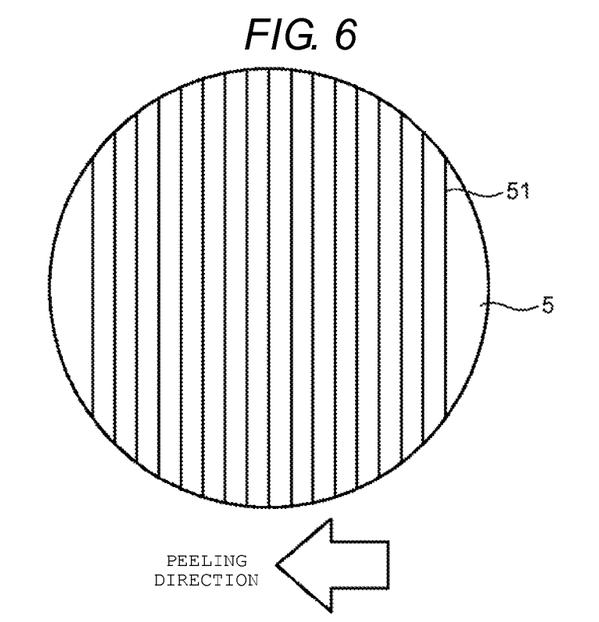

In the supporting substrate 5, the fragile portion 51 is a region (low rigidity region) having a low rigidity. It is preferable that a width of the fragile portion 51 be equal to or less than 0.2 mm, for example. The plane shape of the fragile portion 51 is not particularly limited, but for example, may be a linear shape or a strip shape. As illustrated in FIG. 6, for example, it is preferable that the fragile portion 51 extend to divide the supporting substrate 5 in a plan view. In other words, it is preferable that the fragile portion 51 be provided to be a secant of the supporting substrate 5. For example, the fragile portion 51 is provided to extend in a direction (a perpendicular direction or a direction within ±10 degrees from the perpendicular direction) which intersects a peeling direction of the supporting substrate 5.

In addition, as illustrated in FIG. 6, a plurality of fragile portions 51 may be arranged along the peeling direction of the supporting substrate 5. At this time, it is preferable that an interval of the plurality of fragile portions 51 be equal to or less than 3 mm, for example. By forming the fragile portion 51, when separating the semiconductor substrate 1 and the supporting substrate 5 from each other, it is possible to make it easy to bend the supporting substrate 5.

Figure 7:
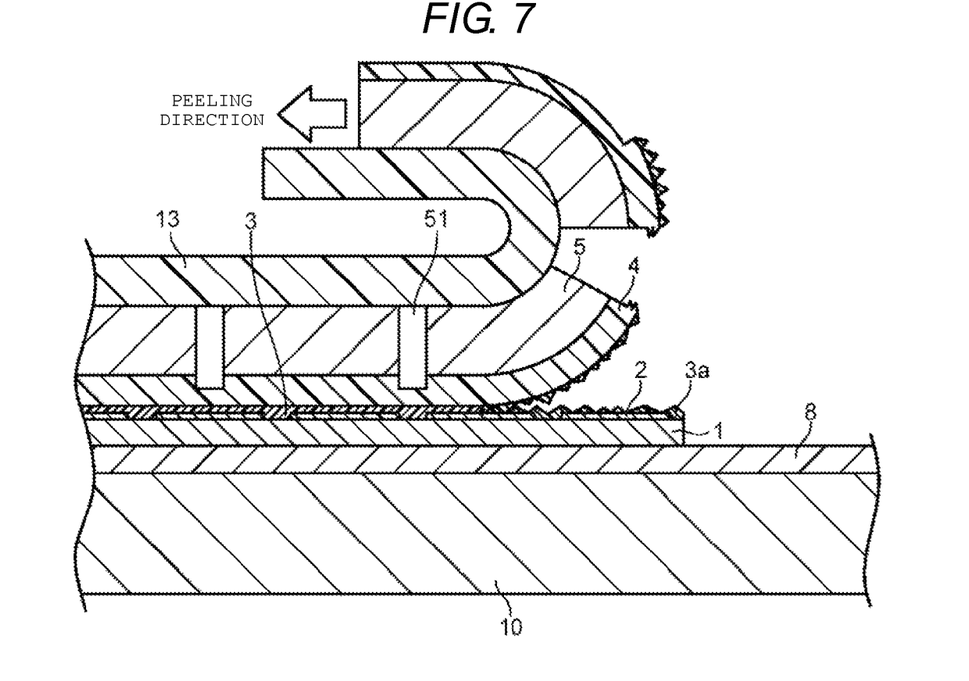

In the separating step (S1-5), as the supporting substrate 5 is peeled off along a direction (peeling direction) which intersects the extending direction of the fragile portion in a plan view of the supporting substrate 5, the semiconductor substrate 1 is separated from the supporting substrate 5. For example, as illustrated in FIG. 7, a transfer tape 13 is attached to the grooved surface of the supporting substrate 5, and the supporting substrate 5 is pulled by the transfer tape 13 when the transfer tape 13 is peeled. Accordingly, it is possible to remove the divided body of the supporting substrate 5 which is divided along the fragile portion 51 with the transfer tape 13, and to peel off the supporting substrate 5 with the adhesive layer 3 as a peeling surface. At this time, a residue 3a of the adhesive layer 3 may remain on the semiconductor substrate 1. In addition, a pulling direction of the supporting substrate 5 is not limited to a direction illustrated in FIG. 7. In addition, in FIG. 7, the adhesive layer 4 is divided along the fragile portion 51 by peeling off, but the adhesive layer 4 may not be necessarily divided.

A pulling method of the transfer tape 13 is not particularly limited. For example, the transfer tape 13 may be attached to a heat transfer tape, and the transfer tape 13 may be pulled as the heat transfer tape is drawn by a roller. In addition, the supporting substrate 5 may be peeled off using other peeling methods.

Figure 8:
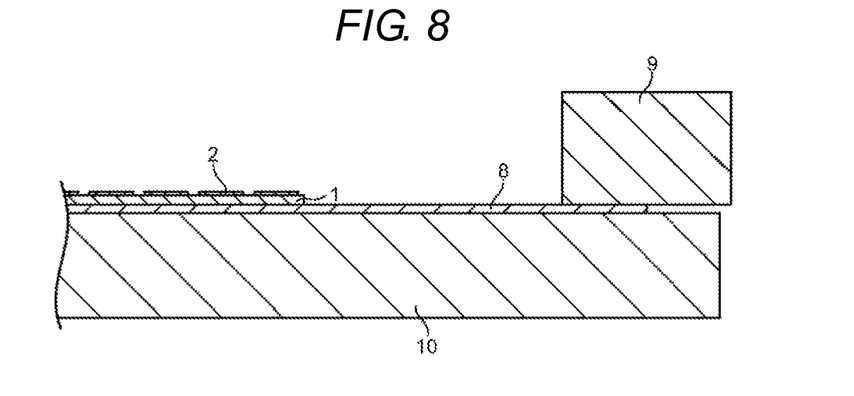

In cleaning step (S1-6), as illustrated in FIG. 8, the residue 3a of the semiconductor substrate 1 is removed. For example, it is possible to remove the residue 3a using a solution, such as pure water or an organic solvent. Examples of the organic solvent include: a keton type, such as p-menthane, d-limonene, p-menthane, acetone, methyl ethyl ketone, cyclohexanone, methyl isoamyl ketone, 2-heptanone, or N-methyl-2-pyrrolidone; a polyhydric alcohol type and a derivative thereof, such as ethylene glycol, ethylene glycol monoacetate, diethylene glycol, diethylene glycol monoacetate, propylene glycol, propylene glycol monoacetate, monomethyl ether of dipropylene glycol or dipropylene glycol monoacetate, monoethyl ether, monopropyl ether, monobutyl ether, or monophenyl ether; a cyclic ether type, such as dioxane; and an ester type, such as methyl lactate, ethyl lactate, methyl acetate, ethyl acetate, butyl acetate, methyl pyruvate, ethyl pyruvate, methyl methoxypropionate, or ethyl ethoxypropionate, and a hydrocarbon type, such as mesitylene. Among these, according to the adhesive to be used, one or more types of organic solvent may be appropriately selected and used. In addition, in the separating step (S1-5), when the residue 3a does not remain, the cleaning step (S1-6) may be omitted.

Figure 9:
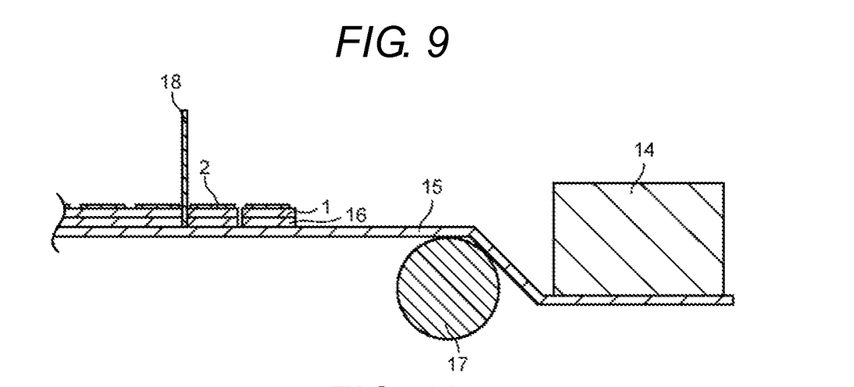

In dicing step (S1-7), the semiconductor substrate 1 is divided into a plurality of semiconductor elements 2. For example, as illustrated in FIG. 9, after the semiconductor substrate 1 is peeled off from the holding tape 8, the semiconductor substrate 1 is adhered via an adhesive tape 16 onto an expanding tape 15 of which edge is fixed to a wafer ring 14. Furthermore, the expanding tape 15 is expanded by applying a difference of elevation between the wafer ring 14 and an expanding ring 17, and the semiconductor substrate 1 is cut by a blade 18, such as the diamond blade. According to this, it is possible to divide the semiconductor substrate 1. In addition, the blade 6, which is used in the trimming step (S1-2), may be used instead of the blade 18.

Figure 10:
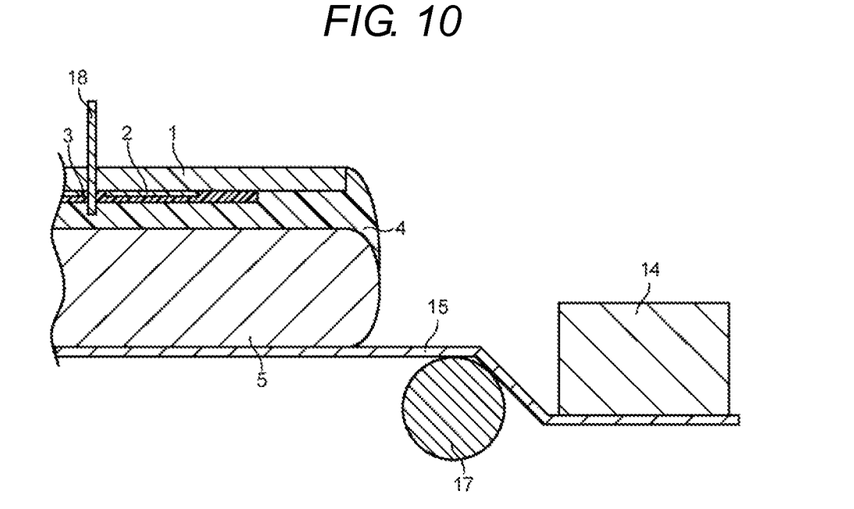

In addition, the dicing step (S1-7) may be performed before the trimming step (S1-2). When the dicing step (S1-7) is performed before the trimming step (S1-2), for example, as illustrated in FIG. 10, the work piece illustrated in FIG. 2 is adhered on the expanding tape 15 of which the circumferential edge is fixed to the wafer ring 14. In addition, the adhesive tape may be provided between the supporting substrate 5 and the expanding tape 15. Furthermore, the expanding tape 15 expands by applying a difference of elevation between the wafer ring 14 and the expanding ring 17, and the semiconductor substrate 1 is cut by the blade 18. According to this, it is possible to divide the semiconductor substrate 1. In addition, if the semiconductor substrate 1 is processed before the semiconductor element 2 is formed, the dicing step (S1-7) may not be performed.

As described above, in the manufacturing method of the semiconductor device according to the embodiment, the work piece that is formed of the supporting substrate having a high rigidity and the semiconductor substrate is prepared, and then the semiconductor substrate housed in the work piece is processed. After this, the fragile portion is formed at one part of the supporting substrate, and the supporting substrate is peeled off from the semiconductor substrate along the direction which intersects the fragile portion. By forming the fragile portion at one part of the supporting substrate, the supporting substrate is likely to be bent as the fragile portion functions as a fulcrum. Accordingly, by peeling off the supporting substrate from the semiconductor substrate after forming the fragile portion, it is possible to bend the supporting substrate without bending the semiconductor substrate and to separate the semiconductor substrate from the supporting substrate. Therefore, it is possible to suppress damage on the semiconductor substrate.

Second Embodiment

In a second embodiment, a manufacturing method of a semiconductor device has a fragile portion forming step (S1-4) that is different from that of the manufacturing method according to the first embodiment.

Similarly to the manufacturing method according to the first embodiment, the manufacturing method according to the present embodiment includes a semiconductor substrate processing step (S1-1), a trimming step (S1-2), a supporting substrate thinning step (S1-3), a fragile portion forming step (S1-4), a separating step (S1-5), a cleaning step (S1-6), and a dicing step (S1-7). Since the semiconductor substrate processing step (S1-1), the trimming step (S1-2), the supporting substrate thinning step (S1-3), the cleaning step (S1-6), and the dicing step (S1-7), are similar to those in the example of the manufacturing method of the semiconductor device according to the first embodiment, here, the description thereof will be omitted.

Figure 11:
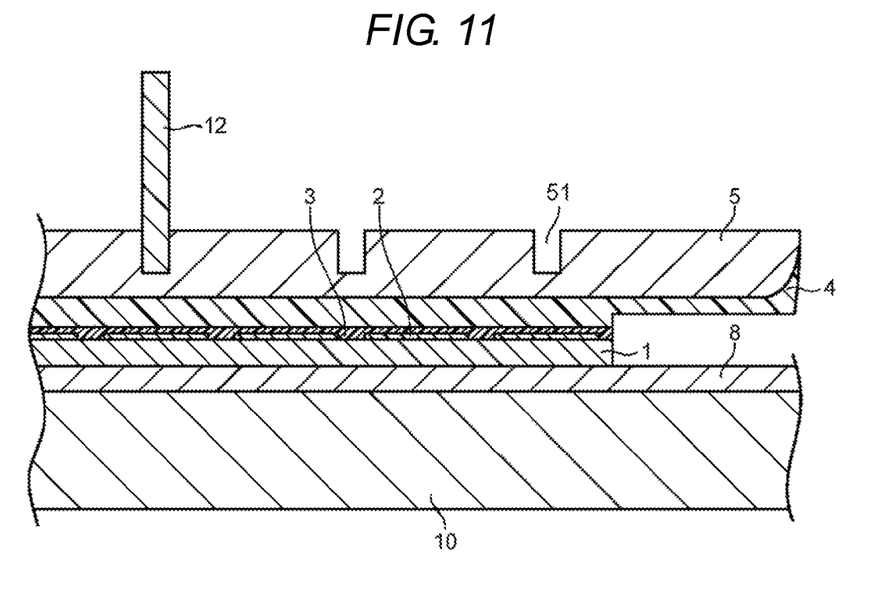
FIGS. 11 and 12 each illustrate a manufacturing step of a manufacturing method of a semiconductor device according to a second embodiment.
Figure 12:
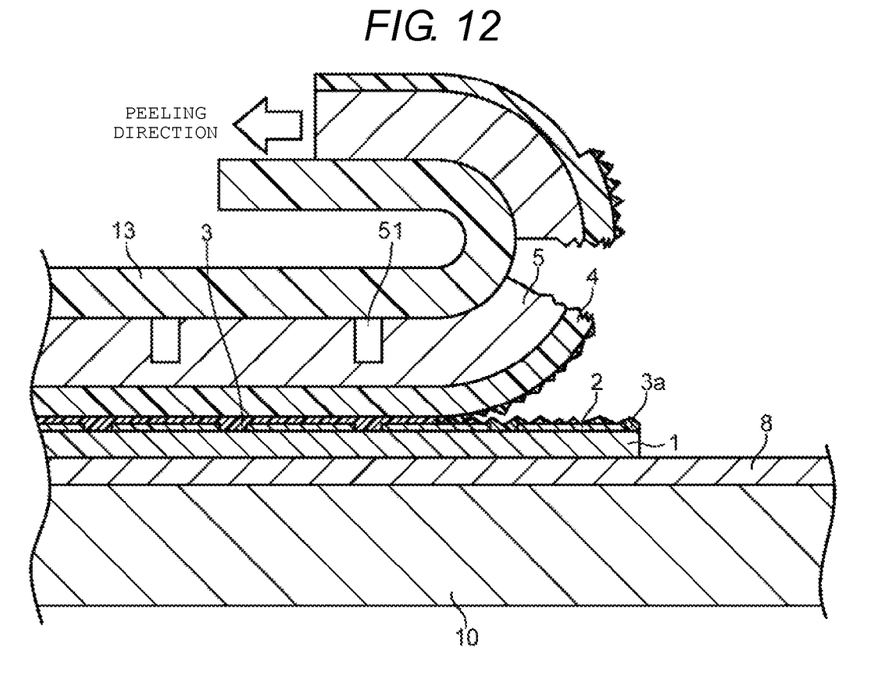

The fragile portion forming step (S1-4) and the separating step (S1-5) in the second embodiment will be described with reference to FIGS. 11 and 12. FIGS. 11 and 12 illustrate the manufacturing method according to the present embodiment.

In the fragile portion forming step (S1-4), the fragile portion 51 having a depth which does not reach the adhesive layer 4 is formed. For example, as illustrated in FIG. 11, by forming a groove up to the middle of the supporting substrate 5 so as not to reach the adhesive layer 4 from the exposed surface of the supporting substrate 5 by using the blade 12, it is possible to form the fragile portion 51. Regarding other conditions, it is possible to employ similar conditions to those used in the fragile portion forming step (S1-4) of the first embodiment.

In the separating step (S1-5), as the supporting substrate 5 is peeled off along a direction (peeling direction) which intersects the extending direction of the fragile portion in a plan view of the supporting substrate 5, the semiconductor substrate 1 is separated from the supporting substrate 5. For example, as illustrated in FIG. 12, the transfer tape 13 is attached to the grooved surface of the supporting substrate 5, and the supporting substrate 5 is pulled by the transfer tape 13 when the transfer tape 13 is peeled. As the supporting substrate 5 is peeled off in FIG. 12, the supporting substrate 5 is divided along the fragile portion 51, and the divided supporting substrates 5 are peeled off. However, the supporting substrate 5 may not be necessarily divided. Regarding other conditions, it is possible to employ similar conditions to those in the separating step (S1-5) in the first embodiment.

As described above, in the manufacturing method of the semiconductor device according to the embodiment, the fragile portion is formed as the groove having a depth which does not reach the adhesive layer is formed. Accordingly, compared to the manufacturing method according to the first embodiment, it is possible to further suppress damage on the semiconductor substrate.

Third Embodiment

In a third embodiment, a manufacturing method of a semiconductor device which has a fragile portion forming step (S1-4) that is different from that of the manufacturing method according to the first embodiment.

Similarly to the manufacturing method according to the first embodiment, the manufacturing method according to the embodiment includes a semiconductor substrate processing step (S1-1), a trimming step (S1-2), a supporting substrate thinning step (S1-3), a fragile portion forming step (S1-4), a separating step (S1-5), a cleaning step (S1-6), and a dicing step (S1-7). Since the semiconductor substrate processing step (S1-1), the trimming step (S1-2), the supporting substrate thinning step (S1-3), the cleaning step (S1-6), and the dicing step (S1-7) are similar to those of the manufacturing method according to the first embodiment, here, the description thereof will be omitted.

Figure 13:
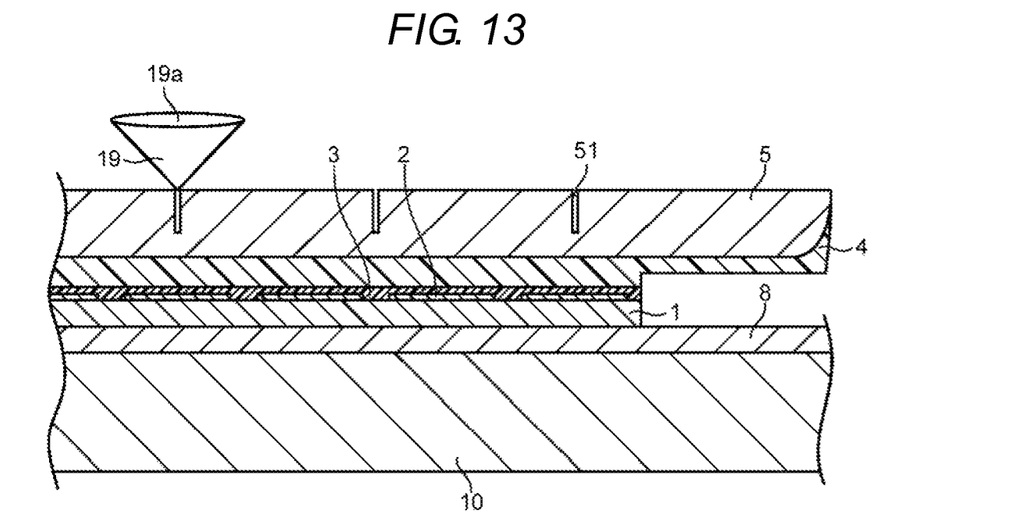
FIGS. 13 and 14 each illustrate a manufacturing step of a manufacturing method of a semiconductor device according to a third embodiment.
Figure 14:
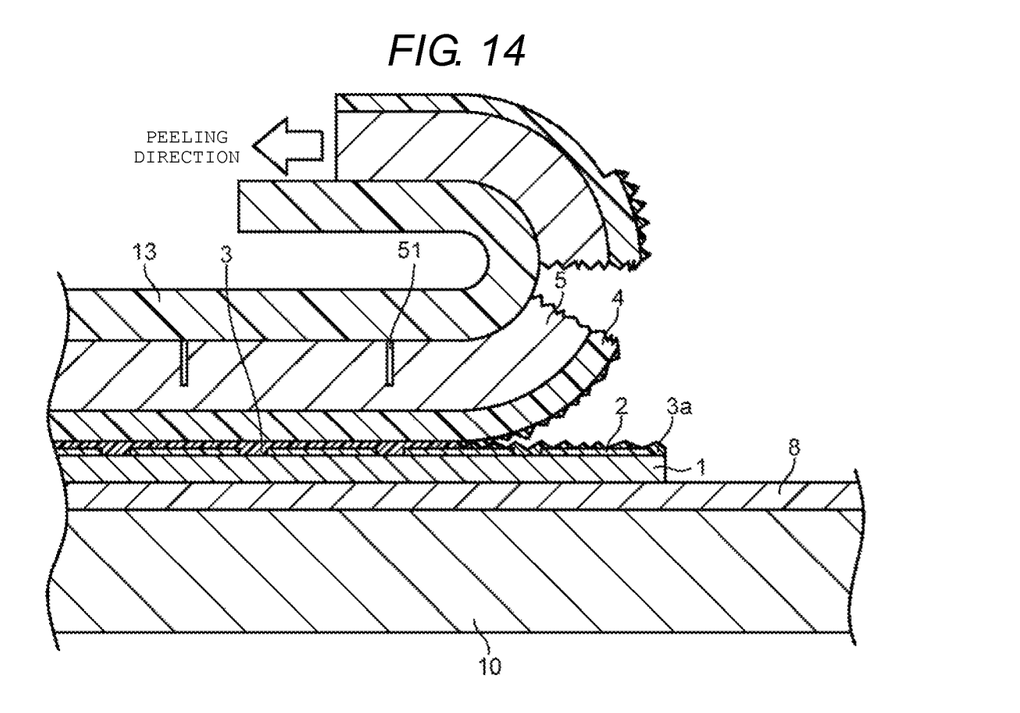

The fragile portion forming step (S1-4) and the separating step (S1-5) in the third embodiment will be described with reference to FIGS. 13 and 14. FIGS. 13 and 14 illustrate the example of the manufacturing method according to the third embodiment.

In the fragile portion forming step (S1-4), for example, as illustrated in FIG. 13, as one part of the supporting substrate 5 is irradiated with an electromagnetic wave, such as laser light 19, having a wavelength absorbed by the supporting substrate 5, using an optical system 19a from the surface opposite to the adhesion surface between the supporting substrate 5 and the adhesive layer 4, the fragile portion 51 is formed. For example, it is possible to condense the laser light 19 using the optical system 19a. One part of the supporting substrate 5 which is irradiated with the laser light 19 is dissociated from the supporting substrate 5 by volume expansion according to sublimation or evaporation. A groove which is formed at one part of the supporting substrate 5 by dissociation becomes the fragile portion 51. The above-described step is also called ablation. It is preferable that the fragile portion 51 have a depth which does not reach the adhesive layer 4. Regarding other conditions, it is possible to employ similar conditions to those in the fragile portion forming step (S1-4) of the first embodiment.

It is preferable that the electromagnetic wave, such as the laser light 19, have a wavelength (for example, a wavelength which is equal to or less than 400 nm) which is equal to or smaller than an ultraviolet ray region. It is preferable that the electromagnetic wave having a wavelength which is equal to or smaller than the ultraviolet ray region be absorbed by the semiconductor substrate, such as the monocrystal silicon. In addition, it is preferable that the semiconductor element 2 is not irradiated with the electromagnetic wave, such as the laser light 19. In order to suppress the influence of the electromagnetic wave with respect to the semiconductor element 2, a protection layer having electromagnetic wave shielding characteristics may be provided between the supporting substrate 5 and the adhesive layer 4. Furthermore, laser light of pulse oscillation may be used as the laser light 19.

In the separating step (S1-5), as the supporting substrate 5 is peeled off along a direction (peeling direction) which intersects the extending direction of the fragile portion in a plan view of the supporting substrate 5, the semiconductor substrate 1 is separated from the supporting substrate 5. For example, as illustrated in FIG. 14, the transfer tape 13 is attached to the grooved surface of the supporting substrate 5, and the supporting substrate 5 is pulled by the transfer tape 13 when the transfer tape 13 is peeled. In FIG. 14, as the supporting substrate 5 is peeled off, the supporting substrate 5 is divided along the fragile portion 51, and the divided supporting substrates 5 are peeled off. However, the supporting substrate 5 may not be necessarily divided. Regarding other conditions, it is possible to employ similar conditions to those in the separating step (S1-5) of the first embodiment.

As described above, in the manufacturing method of the semiconductor device according to the present embodiment, the fragile portion is formed as one part of the supporting substrate 5 that is irradiated with the electromagnetic wave, such as the laser light, and dissociated by ablation. Accordingly, it is possible to suppress damage on the semiconductor substrate during the separation, and to increase a processing speed of the fragile portion.

Fourth Embodiment

In a fourth embodiment, a manufacturing method of a semiconductor device has a fragile portion forming step (S1-4) that is different from that of the manufacturing method according to the first embodiment.

Similarly to the manufacturing method according to the first embodiment, the manufacturing method according to the present embodiment includes a semiconductor substrate processing step (S1-1), a trimming step (S1-2), a supporting substrate thinning step (S1-3), a fragile portion forming step (S1-4), a separating step (S1-5), a cleaning step (S1-6), and a dicing step (S1-7). Since the semiconductor substrate processing step (S1-1), the trimming step (S1-2), the supporting substrate thinning step (S1-3), the cleaning step (S1-6), and the dicing step (S1-7), are similar to those of the manufacturing method according to the first embodiment, here, the description thereof will be omitted.

Figure 15:
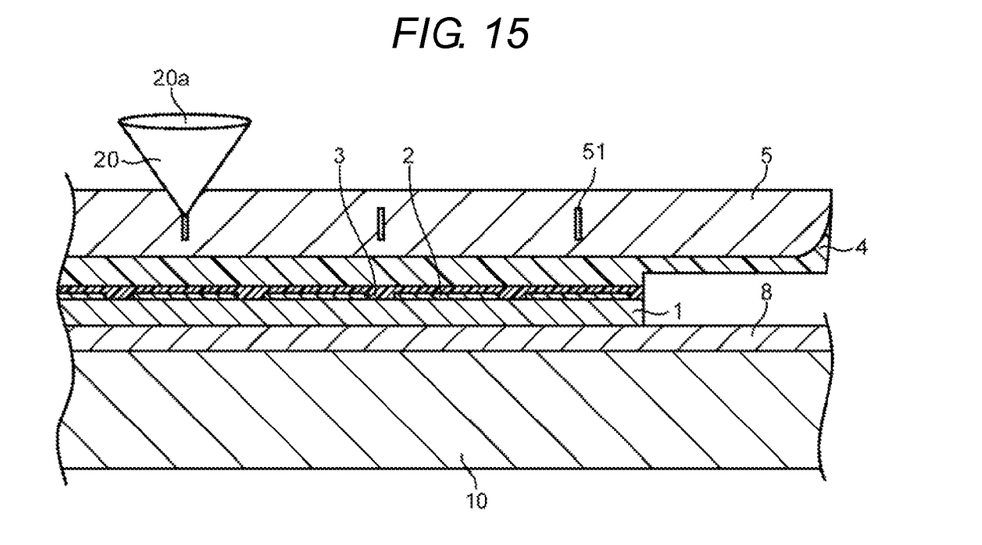
FIGS. 15 and 16 each illustrate a manufacturing step of a manufacturing method of a semiconductor device according to a fourth embodiment.
Figure 16:
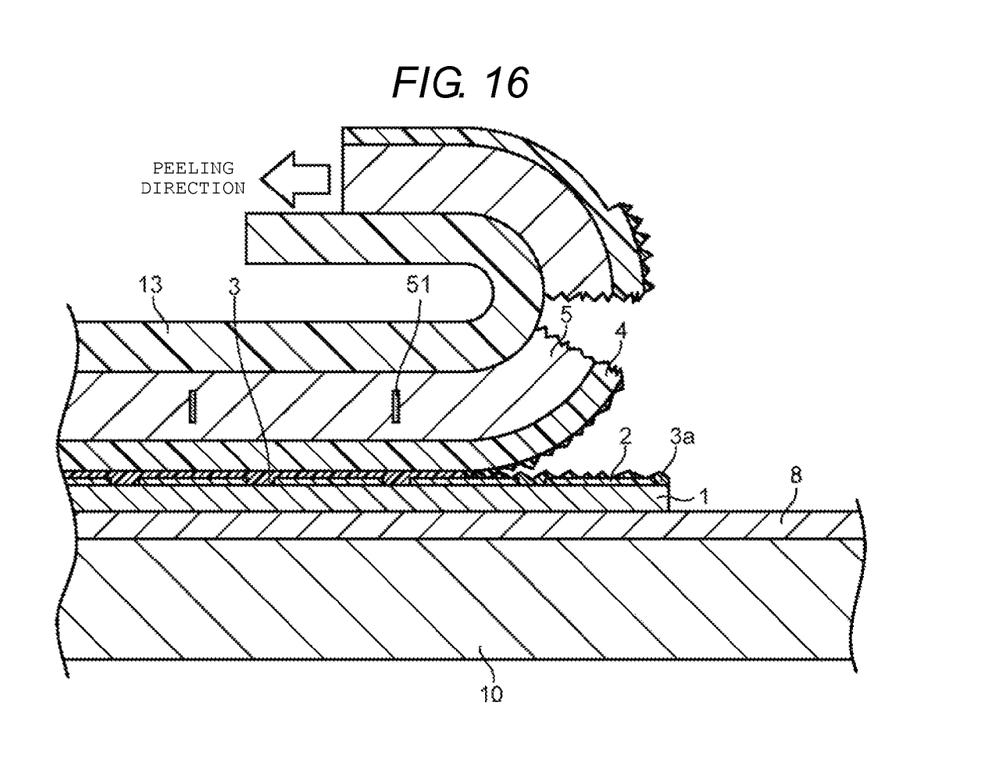

The fragile portion forming step (S1-4) and the separating step (S1-5) according to the fourth embodiment will be described with reference to FIGS. 15 and 16. FIGS. 15 and 16 illustrate an example of the manufacturing method according to the fourth embodiment. Here, the monocrystal silicon substrate is used as the supporting substrate 5.

In the fragile portion forming step (S1-4), for example, as illustrated in FIG. 15, as one part of the supporting substrate 5 is irradiated with the electromagnetic wave, such as laser light 20, having a wavelength which transmits the semiconductor substrate 1, using an optical system 20a, from the surface opposite to the adhesion surface between the supporting substrate 5 and the adhesive layer 4, the fragile portion 51 is formed. For example, it is possible to condense the laser light 20 using the optical system 20a. At one part of the supporting substrate 5 which is irradiated with the laser light 20, a crystal structure is changed to an amorphous or a polycrystal structure. A region (called a defect region) where the crystal structure is changed becomes the fragile portion 51. In addition, a crack from the defect region may extend to the inside of the supporting substrate 5. It is preferable that the fragile portion 51 have a depth which does not reach the adhesive layer 4. In addition, the fragile portion 51 may be provided inside the supporting substrate 5, and may not be exposed to the front surface. Furthermore, not being limited to the monocrystal silicon substrate, other substrates may be used as the supporting substrate 5.

It is preferable that the electromagnetic wave, such as the laser light 20 have a wavelength (for example, a wavelength which exceeds 400 nm) longer than the ultraviolet ray region. It is preferable that the electromagnetic wave having a wavelength which is longer than the ultraviolet ray region, such as an infrared region, transmit the semiconductor substrate 1, such as the monocrystal silicon. For this reason, it is possible to provide the fragile portion 51 inside the semiconductor substrate 1. It is preferable that the semiconductor element 2 is not irradiated with the electromagnetic wave, such as the laser light 20. In order to suppress the influence of the electromagnetic wave with respect to the semiconductor element 2, the protection layer having electromagnetic wave shielding characteristics may be provided between the supporting substrate 5 and the adhesive layer 4. Furthermore, laser light of pulse oscillation may be used as the laser light 20.

In the separating step (S1-5), as the supporting substrate 5 is peeled off along a direction (peeling direction) which intersects the extending direction of the fragile portion in a plan view of the supporting substrate 5, the semiconductor substrate 1 is separated from the supporting substrate 5. For example, as illustrated in FIG. 16, the transfer tape 13 is attached to the processed surface of the supporting substrate 5, and the supporting substrate 5 is pulled by the transfer tape 13 when the transfer tape 13 is peeled. In FIG. 16, as the supporting substrate 5 is peeled off, the supporting substrate 5 is divided along the fragile portion 51, and the divided the supporting substrates 5 are peeled off. However, the supporting substrate 5 may not be necessarily divided. Regarding other conditions, it is possible to employ similar conditions to those in the separating step (S1-5) of the first embodiment.

As described above, in the manufacturing method of the semiconductor device according to the present embodiment, the fragile portion is formed as one part of the supporting substrate 5 that is irradiated with the electromagnetic wave, such as the laser light, and the defect region which changes the crystal structure of the supporting substrate 5 is formed. Accordingly, it is possible to suppress damage on the semiconductor substrate during the separation, and increase a processing speed of the fragile portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
   preparing a structure including a semiconductor substrate having a plurality of semiconductor elements thereon, a cover layer covering the semiconductor elements, a supporting substrate, and an adhesive layer between the cover layer and the supporting substrate;
   removing side edge portions of the semiconductor substrate and the adhesive layer, such that a side surface of the cover layer is exposed;
   forming fragile portions in the supporting substrate, the fragile portions extending in a first direction;
   attaching an adhesive sheet on a surface of the supporting substrate that is opposite to a surface that is in contact with the adhesive layer; and
   pulling on the adhesive sheet in a second direction different from the first direction, to peel off the supporting substrate and the adhesive layer from the semiconductor substrate having the semiconductor elements.

2. The method according to claim 1, wherein the fragile portions are grooves on a surface of the supporting substrate.

3. The method according to claim 2, wherein the grooves are formed into the surface of the supporting substrate to reach the adhesive layer.

4. The method according to claim 2, wherein the groove are formed into the surface of the supporting substrate and do not reach the adhesive layer.

5. The method according to claim 1, wherein the forming of the fragile portions includes
   irradiating a surface of the supporting substrate with an electromagnetic wave.

6. The method according to claim 5, wherein
   a wavelength of the electromagnetic wave is smaller than 400 nm.

7. The method according to claim 5, wherein
a wavelength of the electromagnetic wave is greater than 400 nm.

8. The method according to claim 1, further comprising:
prior to forming the fragile portions, removing a surface portion of the supporting substrate that is opposite to a surface portion facing the adhesive layer, such that a thickness of the supporting substrate becomes thinner.

9. The method according to claim 8, further comprising:
prior to removing the surface portion of the supporting substrate, fixing a surface of the semiconductor substrate to a supporting member.

10. The method according to claim 1, further comprising:
removing a portion of the cover layer remaining on the semiconductor elements after the peeling.

11. The method according to claim 1, further comprising:
dividing the semiconductor substrate into pieces, the pieces having one of the plurality of semiconductor elements.

12. The method according to claim 11, wherein
the dividing of the semiconductor substrate is carried out after the peeling.

13. The method according to claim 1, wherein
the removing of the side edge portions is carried out without removing a side edge portion of the supporting substrate.

14. A method for manufacturing a semiconductor device, comprising:
forming a cover layer on surface of a semiconductor substrate on which a plurality of semiconductor elements is formed;
attaching a supporting substrate to the cover layer with an adhesive layer therebetween;
removing side edge portions of the semiconductor substrate and the adhesive layer, such that a side surface of the cover layer is exposed;
forming fragile portions in the supporting substrate, the fragile portions extending in a first direction;
attaching an adhesive sheet on a surface of the supporting substrate that is opposite to a surface that is in contact with the adhesive layer; and
pulling on the adhesive sheet in a second direction different from the first direction, to peel off the supporting substrate and the adhesive layer from the semiconductor substrate having the semiconductor elements.

15. The method according to claim 14, wherein
the fragile portions are grooves on a surface of the supporting substrate.

16. The method according to claim 15, wherein the grooves are formed into the surface of the supporting substrate to reach the adhesive layer.

17. The method according to claim 15, wherein the groove are formed into the surface of the supporting substrate and do not reach the adhesive layer.

18. The method according to claim 14, wherein the forming of the fragile portions includes
irradiating a surface of the supporting substrate with an electromagnetic wave.

19. The method according to claim 14, further comprising:
dividing the semiconductor substrate into pieces, the pieces having one of the plurality of semiconductor elements.

20. The method according to claim 14, wherein
the removing of the side edge portions is carried out without removing a side edge portion of the supporting substrate.

* * * * *